US012660218B2

(12) United States Patent
Arima et al.

(10) Patent No.: US 12,660,218 B2
(45) Date of Patent: Jun. 16, 2026

(54) SCHOTTKY BARRIER DIODE

(71) Applicant: TDK Corporation, Tokyo (JP)

(72) Inventors: Jun Arima, Tokyo (JP); Minoru Fujita, Tokyo (JP); Katsumi Kawasaki, Tokyo (JP); Jun Hirabayashi, Tokyo (JP)

(73) Assignee: TDK Corporation, Tokyo (JP)

( * ) Notice: Subject to any disclaimer, the term of this patent is extended or adjusted under 35 U.S.C. 154(b) by 308 days.

(21) Appl. No.: 18/260,519

(22) PCT Filed: Jan. 28, 2022

(86) PCT No.: PCT/JP2022/003328
§ 371 (c)(1),
(2) Date: Jul. 6, 2023

(87) PCT Pub. No.: WO2022/181202
PCT Pub. Date: Sep. 1, 2022

(65) Prior Publication Data
US 2024/0072179 A1 Feb. 29, 2024

(30) Foreign Application Priority Data

Feb. 25, 2021 (JP) ................................. 2021-028798

(51) Int. Cl.
*H10D 8/60* (2025.01)
*H10D 62/80* (2025.01)
(52) U.S. Cl.
CPC ............. *H10D 8/605* (2025.01); *H10D 62/80* (2025.01)
(58) Field of Classification Search
CPC ......... H10D 8/605; H10D 62/80; H10D 64/23
See application file for complete search history.

(56) References Cited

U.S. PATENT DOCUMENTS

2015/0228809 A1 8/2015 Sugiura
2016/0254357 A1* 9/2016 Aketa .................. H10D 62/393
257/77

(Continued)

FOREIGN PATENT DOCUMENTS

EP 3780119 A1 2/2021
JP 3691736 B2 9/2005

(Continued)

OTHER PUBLICATIONS

International Search Report issued in corresponding International Patent Application No. PCT/JP2022/003328, dated Mar. 22, 2022, with English translation.

(Continued)

*Primary Examiner* — Syed I Gheyas
(74) *Attorney, Agent, or Firm* — RIMON P.C.

(57) ABSTRACT

To prevent dielectric breakdown of a Schottky barrier diode using gallium oxide. A Schottky barrier diode has a drift layer provided on a semiconductor substrate, an anode electrode, and a cathode electrode. A width W1 of an outer peripheral trench formed in the drift layer is larger than a width W2 of a center trench. An outer peripheral wall S1 of the outer peripheral trench is curved so as to approach vertical toward the outside, while an inner peripheral wall S2 thereof is closer to vertical than the outer peripheral wall S1. This relaxes an electric field which occurs at the outer peripheral bottom portion of the outer peripheral trench upon application of a backward voltage.

5 Claims, 12 Drawing Sheets

13

(56)                    References Cited

U.S. PATENT DOCUMENTS

| | | |
|---|---|---|
| 2017/0301792 A1 | 10/2017 | Konrath et al. |
| 2019/0148563 A1 | 5/2019 | Sasaki et al. |
| 2021/0167225 A1* | 6/2021 | Arima ................. H10D 62/103 |
| 2021/0234009 A1 | 7/2021 | Yuda et al. |
| 2021/0265511 A1 | 8/2021 | Kabutoya |

FOREIGN PATENT DOCUMENTS

| | | |
|---|---|---|
| JP | 2017-199869 A | 11/2017 |
| JP | 2019-079984 A | 5/2019 |
| JP | 2020-004906 A | 1/2020 |
| WO | 2020/004437 A1 | 1/2020 |
| WO | 2020/039971 A1 | 2/2020 |

OTHER PUBLICATIONS

Extended European Search Report issued in corresponding International Patent Application No. 22759243.3, dated Nov. 29, 2024.

* cited by examiner

SCHOTTKY BARRIER DIODE

CROSS REFERENCE TO RELATED APPLICATIONS

This application is the U.S. National Phase under 35 U.S.C. § 371 of International Application No. PCT/JP2022/003328, filed on Jan. 28, 2022, which claims the benefit of Japanese Patent Application No. 2021-028798, filed on Feb. 25, 2021, the entire contents of each are hereby incorporated by reference.

TECHNICAL FIELD

The present invention relates to a Schottky barrier diode and, more particularly, to a Schottky barrier diode using gallium oxide.

BACKGROUND ART

A Schottky barrier diode is a rectifying element utilizing a Schottky barrier generated due to bonding between metal and a semiconductor and is lower in forward voltage and higher in switching speed than a normal diode having a PN junction. Thus, the Schottky barrier diode is sometimes utilized as a switching element for a power device.

When the Schottky barrier diode is utilized as a switching element for a power device, it is necessary to ensure a sufficient backward withstand voltage, so that, silicon carbide (SiC), gallium nitride (GaN), or gallium oxide ($Ga_2O_3$) having a larger band gap is sometimes used in place of silicon (Si). Among them, gallium oxide has a very large band gap (4.8 eV to 4.9 eV) and a large breakdown field of about 8 MV/cm, so that a Schottky barrier diode using gallium oxide is very promising as the switching element for a power device. An example of the Schottky barrier diode using gallium oxide is described in Patent Document 1.

In the Schottky barrier diode described in Patent Document 1, a plurality of trenches are formed in a gallium oxide layer, and a part of an anode electrode is embedded in the trenches through an insulating film. With this structure, when a backward voltage is applied, a mesa region positioned between adjacent trenches becomes a depletion layer, so that a channel region of a drift layer is pinched off. Thus, a leak current upon application of the backward voltage can be significantly reduced.

CITATION LIST

Patent Document

[Patent Document 1] JP 2017-199869A

DISCLOSURE OF THE INVENTION

Problem to be Solved by the Invention

However, in conventional Schottky barrier diodes having the trenches, an electric field concentrates on the outer peripheral bottom portion of an outermost peripheral trench upon application of a backward voltage, so that dielectric breakdown is likely to occur at this portion.

It is therefore an object of the present invention to prevent, in a Schottky barrier diode using gallium oxide, dielectric breakdown by relaxing an electric field occurring upon application of a backward voltage.

Means for Solving the Problem

A Schottky barrier diode according to the present invention includes a semiconductor substrate made of gallium oxide, a drift layer made of gallium oxide and provided on the semiconductor substrate, an anode electrode brought into Schottky contact with the drift layer, a cathode electrode brought into ohmic contact with the semiconductor substrate, and a first insulating film covering the inner wall of a trench formed in the drift layer. The trench includes a ring-shaped outer peripheral trench and a center trench formed in an area surrounded by the outer peripheral trench. A part of the anode electrode is embedded in the outer and center trenches through the first insulating film. The outer peripheral trench is larger in width than the center trench. The outer peripheral wall of the outer peripheral trench is curved so as to approach vertical toward the outside. The inner peripheral wall of the outer peripheral trench is closer to vertical than the outer peripheral wall.

According to the present invention, the outer peripheral wall of the outer peripheral trench is curved so as to approach vertical toward the outside, thereby relaxing an electric field which occurs at the outer peripheral bottom portion of the outer peripheral trench upon application of a backward voltage. In addition, the inner peripheral wall of the outer peripheral trench is closer to vertical than the outer peripheral wall, thereby preventing the mesa width between the center trench and the outer peripheral trench from excessively increasing.

In the present invention, the outer peripheral trench may be larger in depth than the center trench. This can further relax an electric field occurring at the outer peripheral bottom portion of the outer peripheral trench.

The Schottky barrier diode according to the present invention may further include a second insulating film that covers the anode electrode inside the outer peripheral trench. Thus, the anode electrode is protected by the second insulating film.

Advantageous Effects of the Invention

As described above, according to the present invention, an electric field occurring upon application of a backward voltage is relaxed, whereby it is possible to prevent dielectric breakdown of a Schottky barrier diode using gallium oxide.

MODE FOR CARRYING OUT THE INVENTION

Hereinafter, preferred embodiments of the present invention will be described in detail with reference to the accompanying drawings.

First Embodiment

Figure 1:
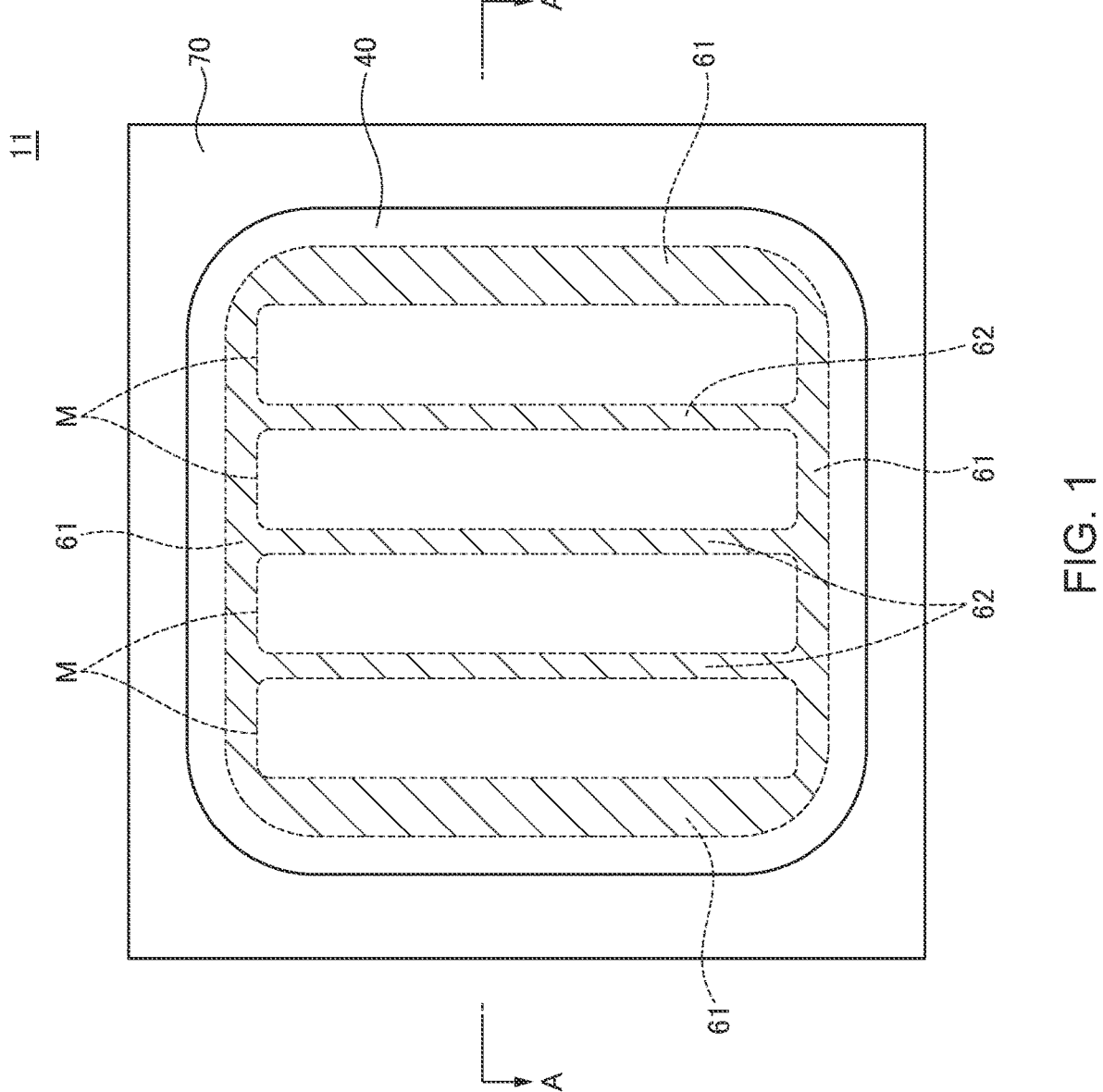
FIG. 1 is a schematic plan view illustrating the configuration of a Schottky barrier diode 11 according to a first embodiment of the present invention.
Figure 2:
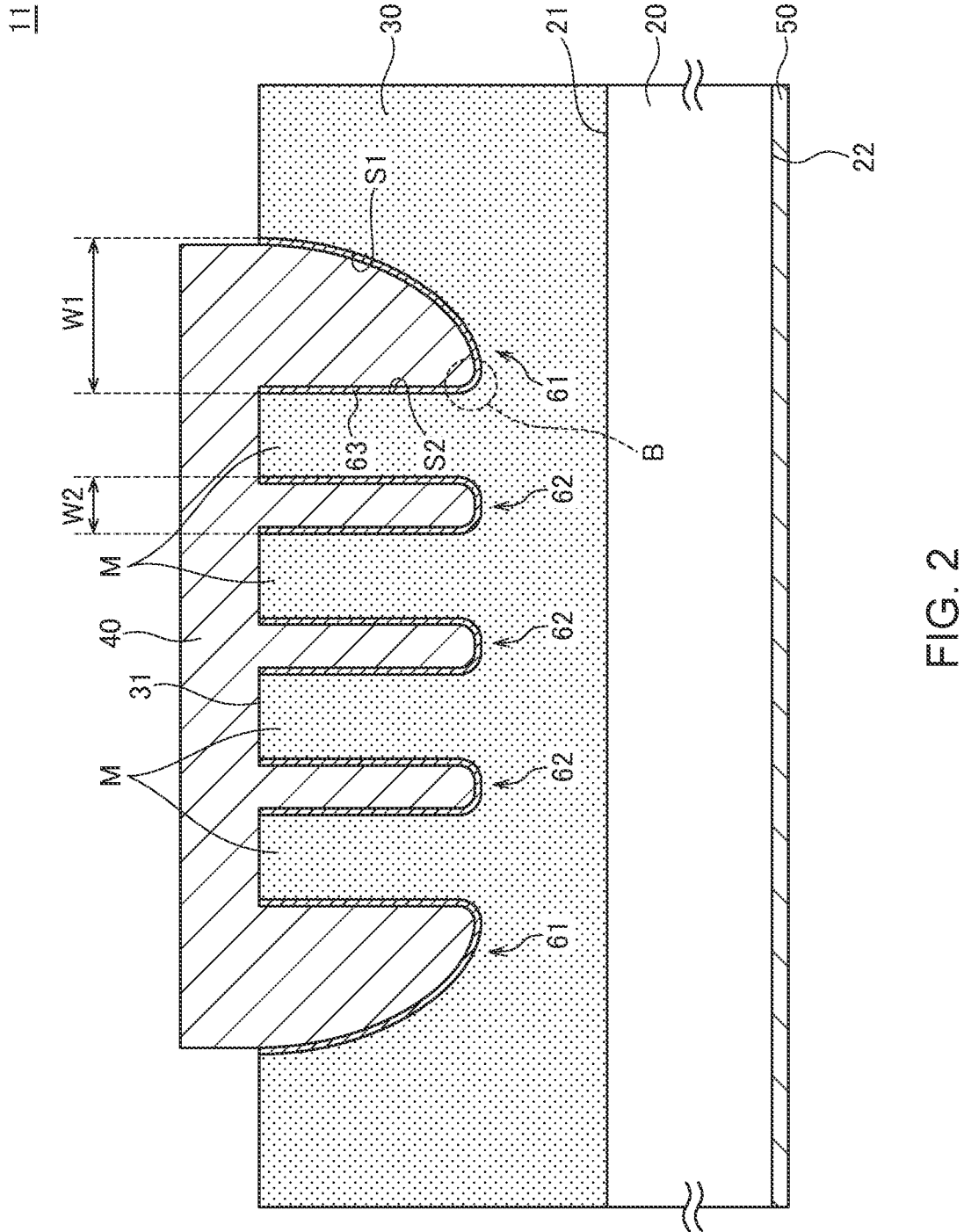
FIG. 2 is a schematic cross-sectional view taken along the line A-A in FIG. 1.

FIG. 1 is a schematic plan view illustrating the configuration of a Schottky barrier diode 11 according to a first embodiment of the present invention. FIG. 2 is a schematic cross-sectional view taken along the line A-A in FIG. 1.

As illustrated in FIGS. 1 and 2, the Schottky barrier diode 11 according to the present embodiment has a semiconductor substrate 20 and a drift layer 30, both of which are made of gallium oxide ($\beta$-Ga$_2$O$_3$). The semiconductor substrate 20 and drift layer 30 are each introduced with silicon (Si) or tin (Sn) as an n-type dopant. The concentration of the dopant is higher in the semiconductor substrate 20 than in the drift layer 30, whereby the semiconductor substrate 20 and the drift layer function as an n$^+$ layer and an n$^-$ layer, respectively.

The semiconductor substrate 20 is obtained by cutting a bulk crystal formed using a melt-growing method, and the thickness thereof is about 250 μm. Although there is no particular restriction on the planar size of the semiconductor substrate 20, the planar size is generally selected in accordance with the amount of current flowing in the element and, when the maximum amount of forward current is about 20 A, the planar size may be set to about 2.4 mm×2.4 mm.

The semiconductor substrate 20 has an upper surface 21 positioned on the upper surface side in a mounted state and a back surface 22 facing away from the upper surface 21 and positioned on the lower surface side in a mounted state. A drift layer 30 is formed on the entire upper surface 21. The drift layer 30 is a thin film obtained by epitaxially growing gallium oxide on the upper surface 21 of the semiconductor substrate 20 using a reactive sputtering method, a PLD method, an MBE method, an MOCVD method, or an HVPE method. Although there is no particular restriction on the film thickness of the drift layer 30, the film thickness is generally selected in accordance with the backward withstand voltage of the element and, in order to ensure a withstand voltage of about 600 V, the film thickness may be set to, e.g., about 7 μm.

An anode electrode 40 brought into Schottky contact with the drift layer 30 is formed on an upper surface 31 of the drift layer 30. The anode electrode 40 is formed of metal such as platinum (Pt), palladium (Pd), gold (Au), nickel (Ni), molybdenum (Mo), or Copper (Cu). The anode electrode 40 may have a multilayer structure of different metal films, such as Pt/Au, Pt/Al, Pd/Au, Pd/Al, Pt/Ti/Au, or Pd/Ti/Au. On the other hand, a cathode electrode 50 brought into ohmic contact with the semiconductor substrate is formed on the back surface 22 of the semiconductor substrate 20. The cathode electrode 50 is formed of metal such as titanium (Ti). The cathode electrode 50 may have a multilayer structure of different metal films, such as Ti/Au or Ti/Al.

In the present embodiment, a plurality of trenches 61 and 62 are formed in the drift layer 30. The trenches 61 and 62 are each formed at a position overlapping the anode electrode 40 in a plan view. The trench 61 is an outer peripheral trench formed into a ring shape, and the trenches 62 are center trenches formed in an area surrounded by the outer peripheral trench. The outer peripheral trench 61 and the center trenches need not completely be separated from each other, but may be connected to each other as illustrated in FIG. 1. In the present embodiment, the outer peripheral trench 61 and the center trenches 62 have the same depth.

The inner wall of each of the trenches 61 and 62 is covered with an insulating film 63 made of, e.g., HfO$_2$, and the inside thereof is filled with the same material as the anode electrode 40. In the present embodiment, since the plurality of trenches 61 and 62 are formed in the drift layer 30, the anode electrode 40 may be made of a material having a low work function such as molybdenum (Mo) or copper (Cu). Further, since the plurality of trenches 61 and 62 are formed in the drift layer 30, the dopant concentration of the drift layer 30 can be increased to about $4\times10^{16}$ cm$^{-3}$.

A part of the drift layer 30 that is sectioned by the trenches 61 and 62 constitutes a mesa region M. The mesa region M becomes a depletion layer when a backward voltage is applied between the anode electrode 40 and the cathode electrode 50, so that a channel region of the drift layer is pinched off. Thus, a leak current upon application of the backward voltage can be significantly reduced.

In the present embodiment, assuming that the widths of the outer peripheral trench 61 and the center trench 62 along the line A-A are W1 and W2, respectively, W1>W2 is satisfied.

The width W1 of the of the outer peripheral trench 61 refers to a width in the radial direction, and the width W2 of the center trench 62 refers to a width in the mesa width direction.

An outer peripheral wall S1 of the outer peripheral trench 61 is gently curved so as to approach vertical toward the outside, while an inner peripheral wall S2 thereof is closer to vertical than the outer peripheral wall S1. That is, although the inclination of the outer peripheral wall S1 of the outer peripheral trench 61 with respect to the upper surface 31 of the drift layer 30 is small in the vicinity of the boundary with the inner peripheral wall S2, it gradually increases toward the outside and eventually becomes substantially vertical in the vicinity of the upper surface 31 of the drift layer 30. In other words, the radial cross section of the outer peripheral wall S1 depicts a quadratic curve. On the other hand, the inner peripheral wall S2 of the outer peripheral trench 61 is substantially vertical although it is curved slightly in the vicinity of the boundary with the outer peripheral wall S1.

As describe above, in the present embodiment, the radial cross section of the outer peripheral trench 61 is asymmetric. One of the reasons that the width W1 of the outer peripheral trench 61 is set larger than the width W2 of the center trench 62 is to ensure a radial space large enough to allow the outer peripheral wall S1 to be gently curved. The outer peripheral trench 61 having such a shape can be formed by, for example, etching the drift layer 30 in multiple steps using a plurality of masks.

Figure 3:
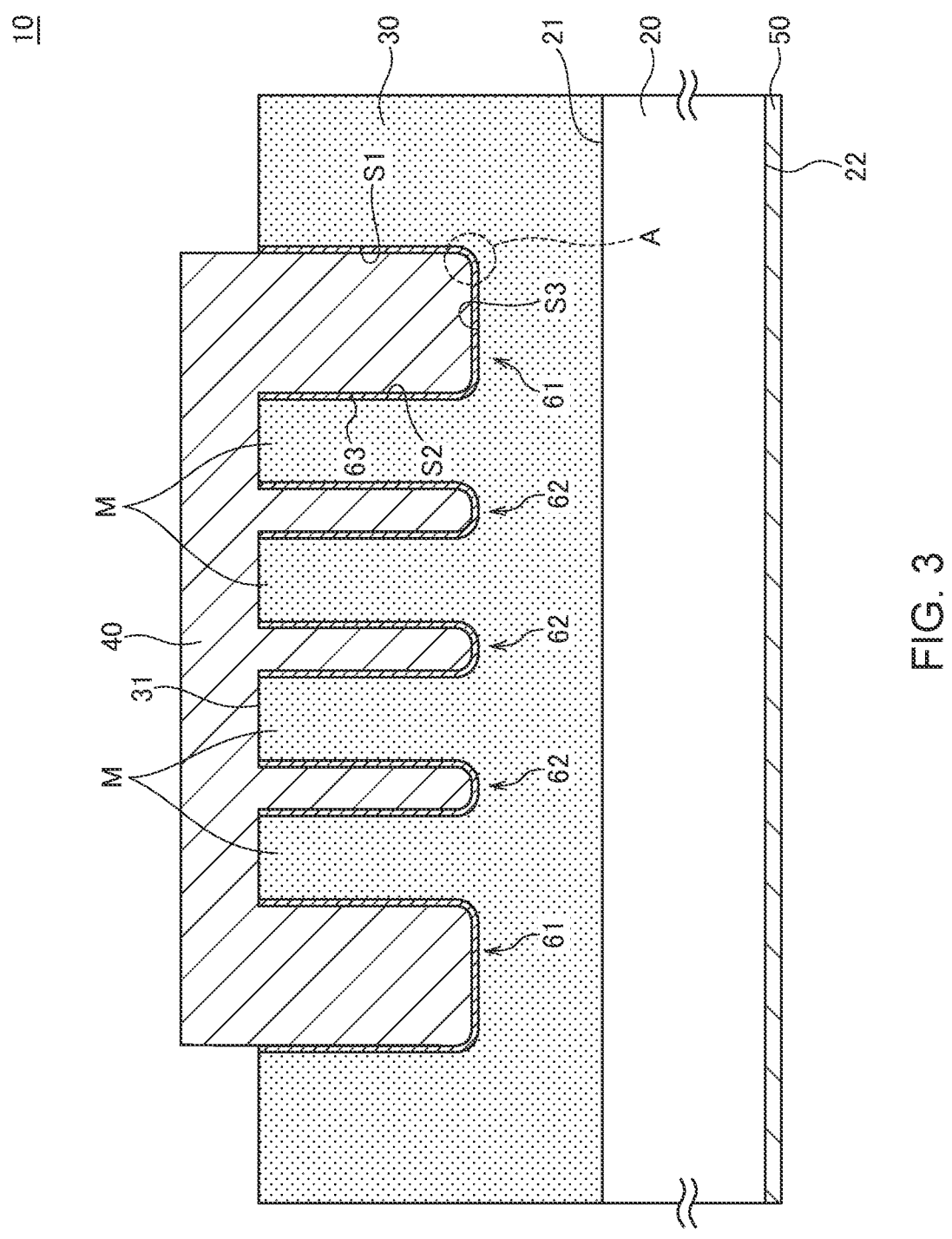
FIG. 3 is a schematic cross-sectional view illustrating the configuration of a Schottky barrier diode 10 according to a Comparative Example.

FIG. 3 is a schematic cross-sectional view illustrating the configuration of a Schottky barrier diode according to a comparative example.

In the Schottky barrier diode 10 illustrated in FIG. 3, the radial cross section of the outer peripheral trench 61 is symmetric, and both the outer peripheral wall S1 and the inner peripheral wall S2 are nearly vertical. In such a structure, the curvature radius of an outer peripheral bottom portion A positioned between the outer peripheral wall S1 and a bottom surface S3 is small, so that an electric field concentrates on this portion, which may result in dielectric breakdown.

On the other hand, in the Schottky barrier diode 11 according to the present embodiment, the radial cross cross-section of the outer peripheral trench 61 is asymmetric, and the outer peripheral wall S1 itself constitutes a gently curved surface having a large curvature radius, so that an electric field is widely distributed. In the present embodiment, although the curvature radius of an inner peripheral bottom portion B positioned between the outer peripheral wall S1 and the inner peripheral wall S2 is comparatively small, the outer peripheral wall S1 itself having a large curvature radius distributes an electric field, substantially preventing concentration of an electric field at the inner peripheral bottom portion B. In addition, the inner peripheral wall S2 is substantially vertical with respect to the upper surface 31 of the drift layer 30, thereby preventing the mesa width of the mesa region M formed between the outer peripheral trench 61 and the center trench 62 from excessively increasing. This allows the channel region of the drift layer 30 to be pinched off reliably upon application a backward voltage.

As described above, in the Schottky barrier diode 11 according to the present embodiment, the outer peripheral wall S1 itself of the outer peripheral trench 61 constitutes a curved surface having a large curvature radius, so that local concentration of an electric field is less likely to occur even when a backward voltage is applied. This makes it possible to prevent dielectric breakdown at the outer peripheral bottom portion of the outer peripheral trench 61, which is likely to occur upon application of a backward voltage.

Second Embodiment

Figure 4:
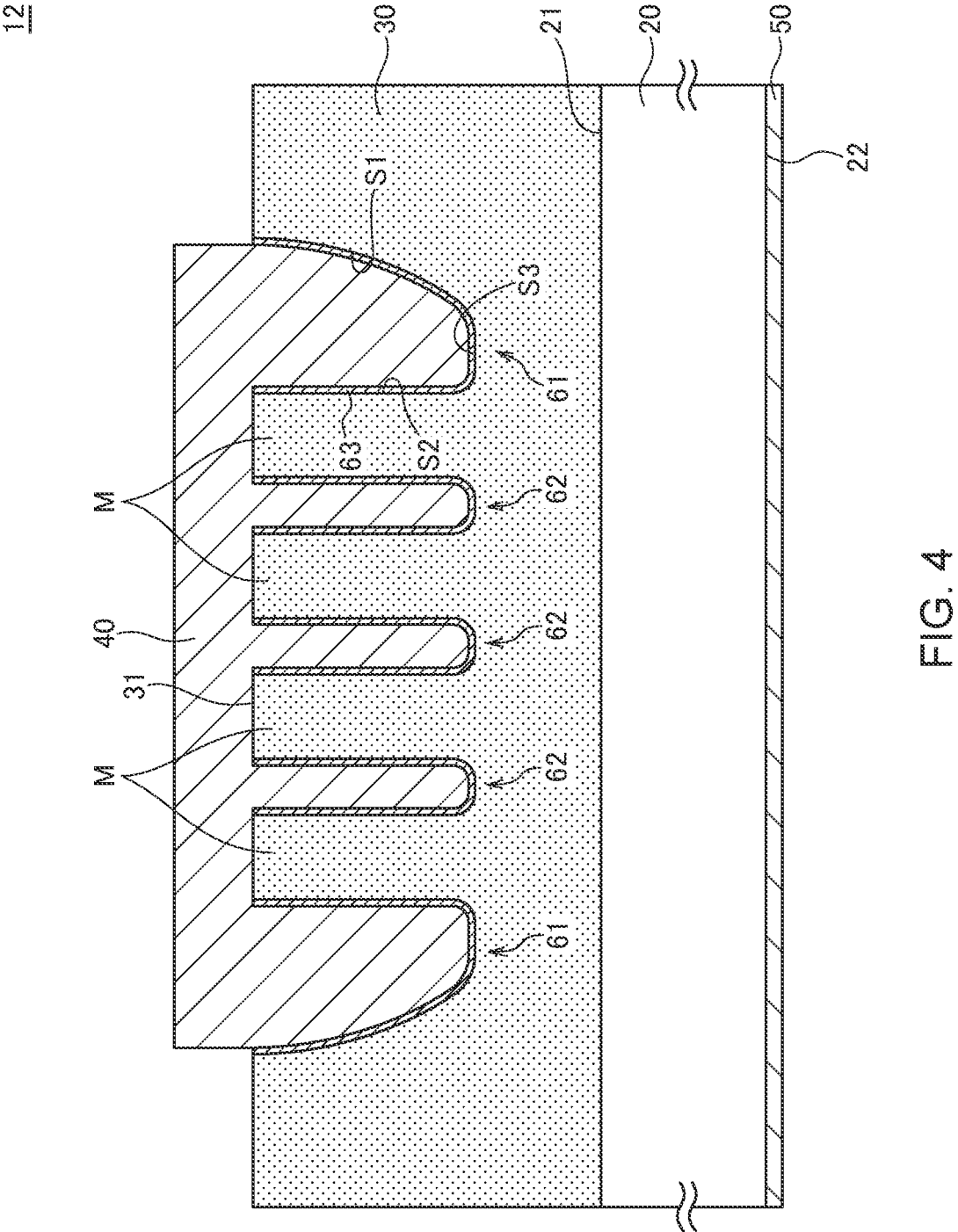
FIG. 4 is a schematic cross-sectional view illustrating the configuration of a Schottky barrier diode 12 according to a second embodiment of the present invention.

FIG. 4 is a schematic cross-sectional view illustrating the configuration of a Schottky barrier diode 12 according to a second embodiment of the present invention.

As illustrated in FIG. 4, the Schottky barrier diode 12 according to the second embodiment differs from the Schottky barrier diode 11 according to the first embodiment in that the outer peripheral trench 61 has a substantially flat bottom surface S3. Other basic configurations are the same as those of the Schottky barrier diode 11 according to the first embodiment, so the same reference numerals are given to the same elements, and overlapping description will be omitted.

As described in the present embodiment, in the present invention, substantially the flat bottom surface S3 may exist between the outer peripheral wall S1 and the inner peripheral wall S2.

Third Embodiment

Figure 5:
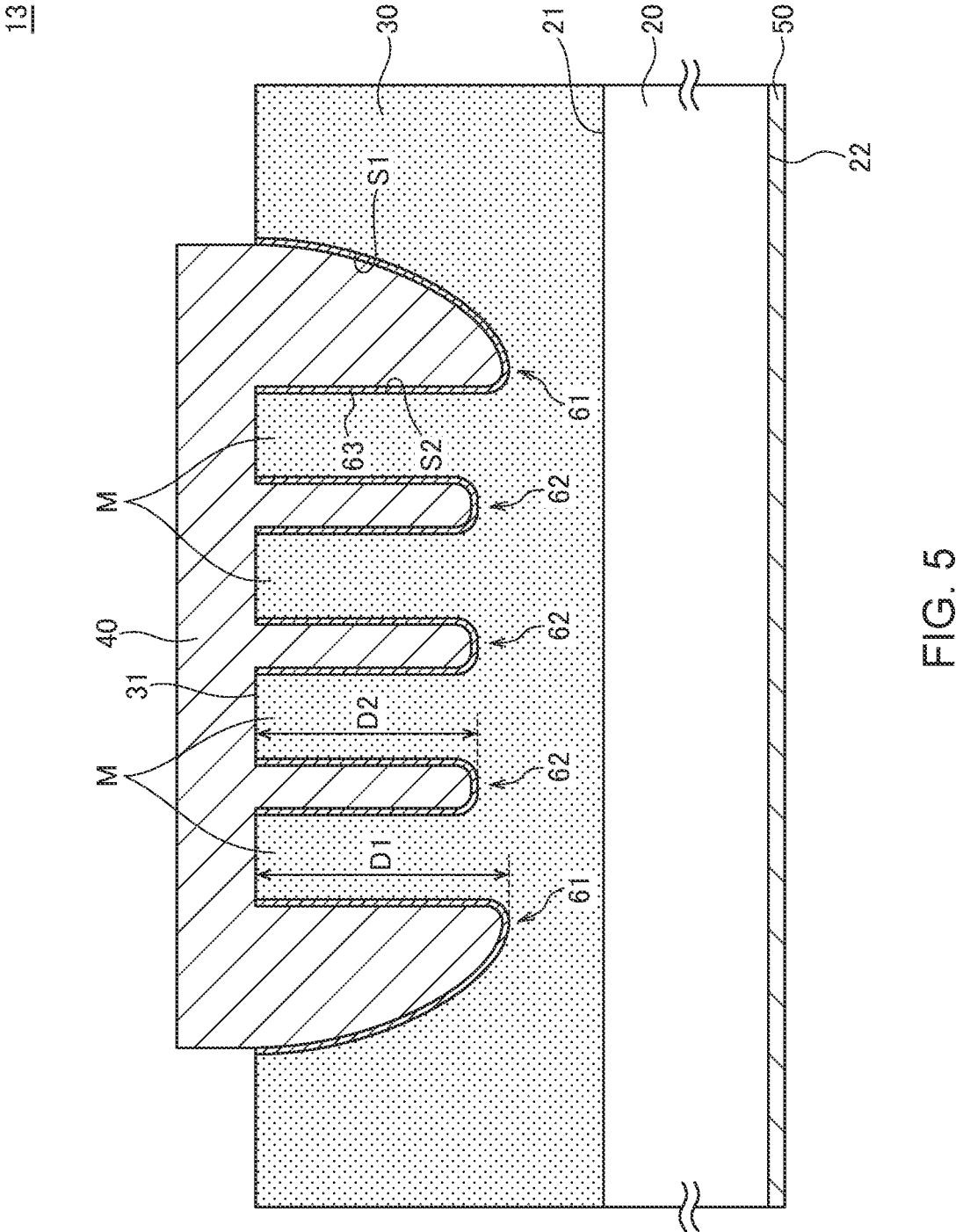
FIG. 5 is a schematic cross-sectional view illustrating the configuration of a Schottky barrier diode 13 according to a third embodiment of the present invention.

FIG. 5 is a schematic cross-sectional view illustrating the configuration of a Schottky barrier diode 13 according to a third embodiment of the present invention.

As illustrated in FIG. 5, the Schottky barrier diode 13 according to the third embodiment differs from the Schottky barrier diode 11 according to the first embodiment in that a depth D1 of the outer peripheral trench 61 is larger than a depth D2 of the center trench 62. Other basic configurations are the same as those of the Schottky barrier diode 11 according to the first embodiment, so the same reference numerals are given to the same elements, and overlapping description will be omitted.

When the depth D1 of the outer peripheral trench 61 is made larger than the depth D2 of the center trench 62 as in the present embodiment, the curvature radius of the outer peripheral wall S1 of the outer peripheral trench 61 further increases, thus further relaxing concentration of an electric field. However, excessively large depth D1 of the outer peripheral trench 61 excessively reduces the film thickness of the drift layer 30 positioned at the bottom of the outer peripheral trench 61, which actually strengthens an electric field. Thus, the depth D1 of the outer peripheral trench 61 is preferably set such that the thickness of the drift layer 30 positioned at the bottom of the outer peripheral trench 61 is equal to or more than 1 mm.

Fourth Embodiment

Figure 6:
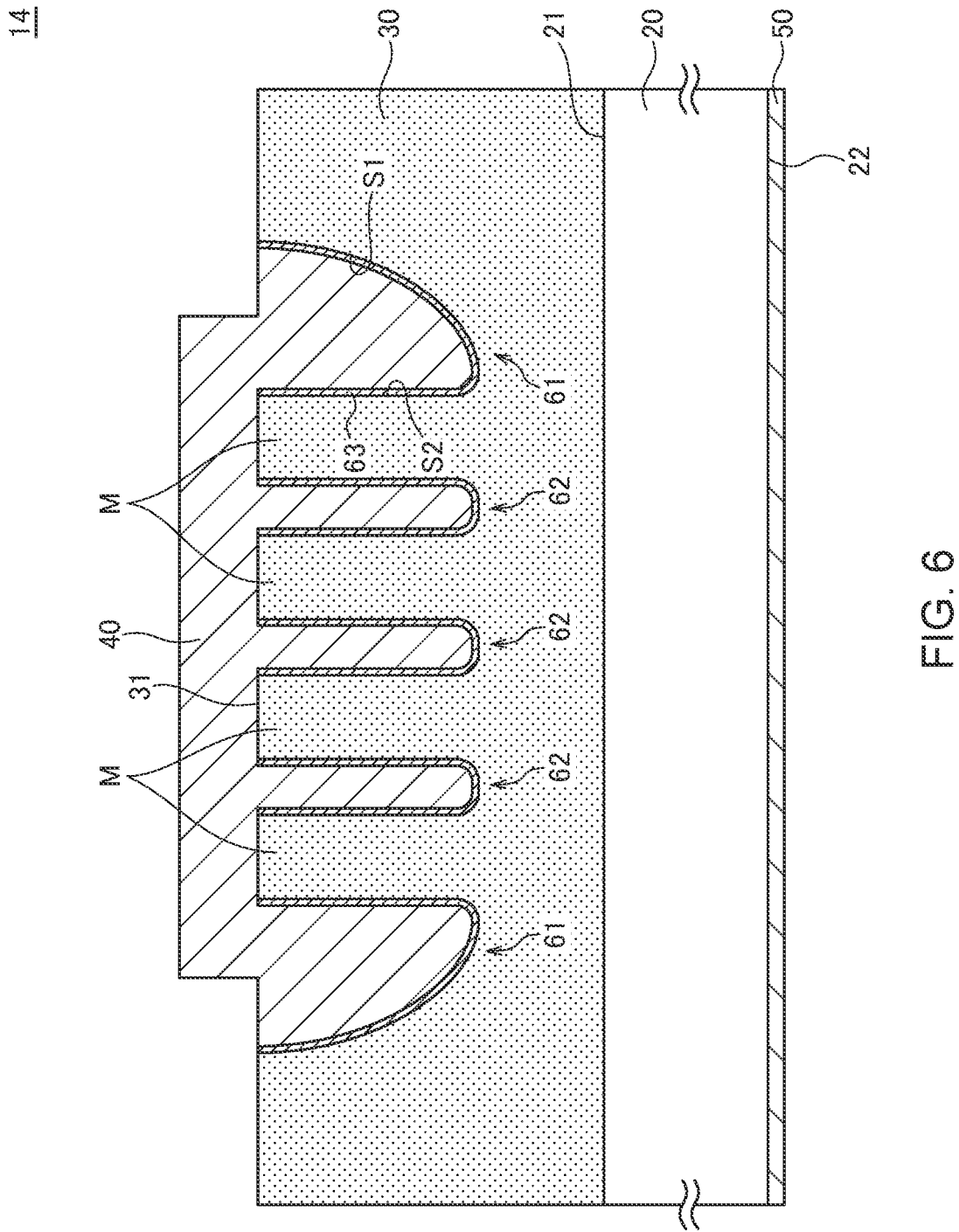
FIG. 6 is a schematic cross-sectional view illustrating the configuration of a Schottky barrier diode 14 according to a fourth embodiment of the present invention.

FIG. 6 is a schematic cross-sectional view illustrating the configuration of a Schottky barrier diode 14 according to a fourth embodiment of the present invention.

As illustrated in FIG. 6, the Schottky barrier diode 14 according to the fourth embodiment differs from the Schottky barrier diode 11 according to the first embodiment in that a part of the anode electrode 40 that is positioned above the outer peripheral trench 61 is removed. Other basic configurations are the same as those of the Schottky barrier diode 11 according to the first embodiment, so the same reference numerals are given to the same elements, and overlapping description will be omitted.

As described in the present embodiment, in the present invention, the upper surface of the anode electrode 40 need not be flat but may be partly removed.

Fifth Embodiment

Figure 7:
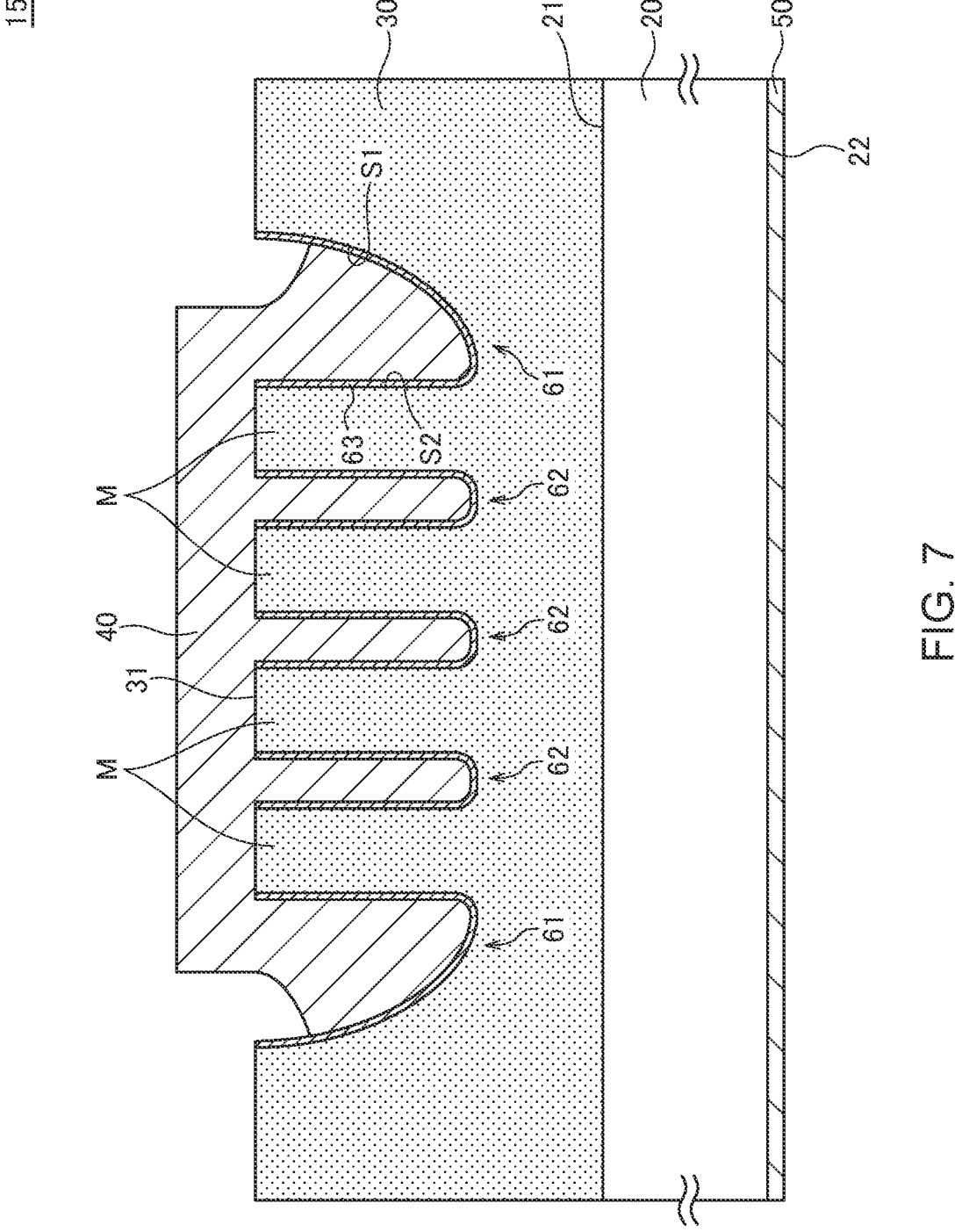
FIG. 7 is a schematic cross-sectional view illustrating the configuration of a Schottky barrier diode according to a fifth embodiment of the present invention.

FIG. 7 is a schematic cross-sectional view illustrating the configuration of a Schottky barrier diode according to a fifth embodiment of the present invention.

As illustrated in FIG. 7, the Schottky barrier diode 15 according to the fifth embodiment differs from the Schottky barrier diode 11 according to the first embodiment in that a part of the anode electrode 40 that is positioned inside the outer peripheral trench 61 is removed. Other basic configurations are the same as those of the Schottky barrier diode 11 according to the first embodiment, so the same reference numerals are given to the same elements, and overlapping description will be omitted.

As described in the present embodiment, in the present invention, the outer peripheral trench 61 need not be filled with the anode electrode 40 but may have a void partially.

Sixth Embodiment

Figure 8:
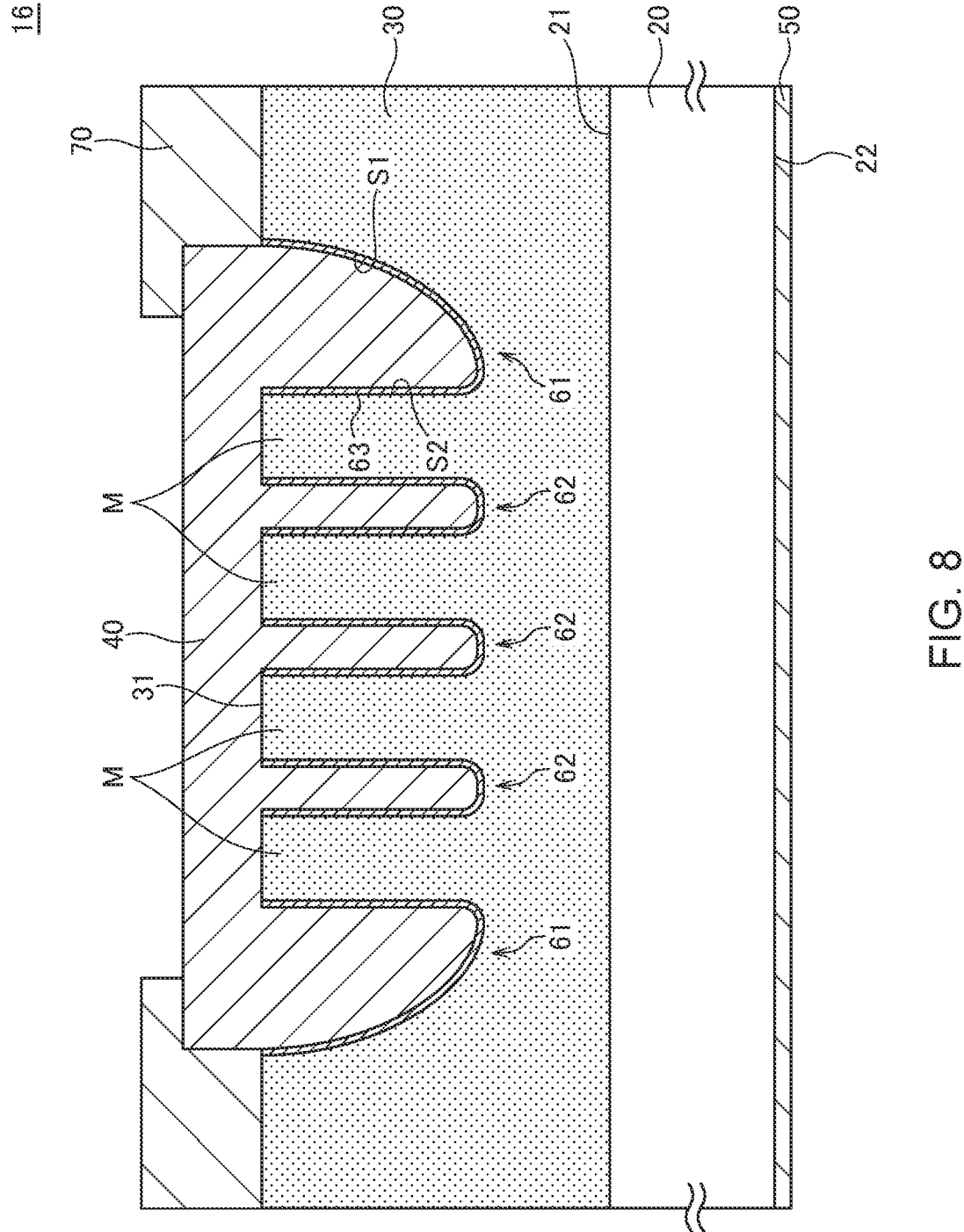
FIG. 8 is a schematic cross-sectional view illustrating the configuration of a Schottky barrier diode 16 according to a sixth embodiment of the present invention.

FIG. 8 is a schematic cross-sectional view illustrating the configuration of a Schottky barrier diode 16 according to a sixth embodiment of the present invention.

As illustrated in FIG. 8, the Schottky barrier diode 16 according to the sixth embodiment differs from the Schottky barrier diode 11 according to the first embodiment in that the outer periphery of the anode electrode 40 is covered with an insulating film 70. Other basic configurations are the same as those of the Schottky barrier diode 11 according to the first embodiment, so the same reference numerals are given to the same elements, and overlapping description will be omitted.

Examples of the material of the insulating layer 70 may include: various resin materials, including epoxy resin, acrylic resin such as polymethyl metacrylate, polyurethane, polyimide, polyvinyl alcohol, fluororesin, and polyolefin; and inorganic oxides or nitrides such as silicon oxide, aluminum oxide, and silicon nitride.

As described in the present embodiment, in the present invention, the outer periphery of the anode electrode 40 may be covered with the insulating film 70.

Seventh Embodiment

Figure 9:
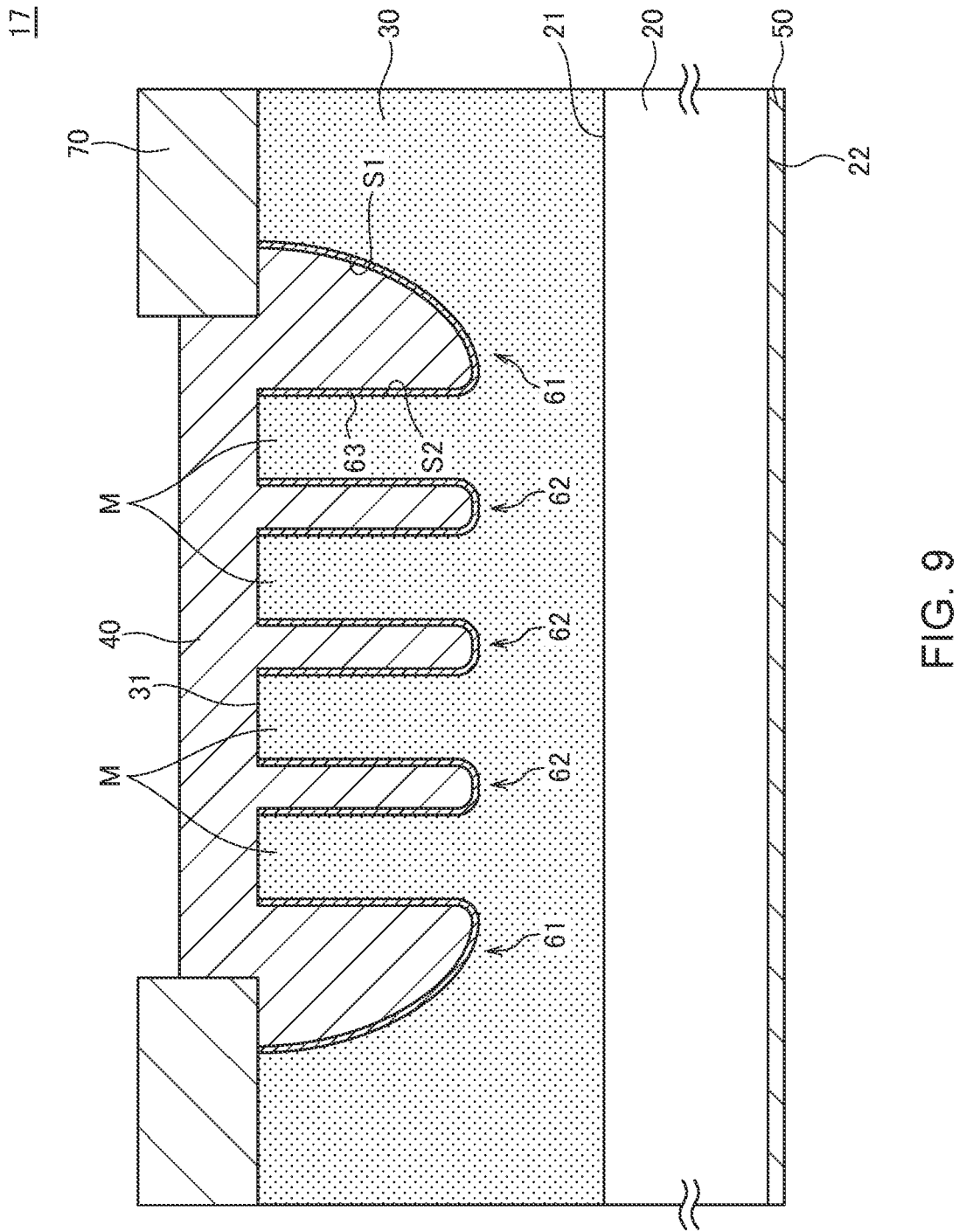
FIG. 9 is a schematic cross-sectional view illustrating the configuration of a Schottky barrier diode 17 according to a seventh embodiment of the present invention.

FIG. 9 is a schematic cross-sectional view illustrating the configuration of a Schottky barrier diode 17 according to a seventh embodiment of the present invention.

As illustrated in FIG. 9, the Schottky barrier diode 17 according to the seventh embodiment differs from the Schottky barrier diode 14 according to the fourth embodiment in that the outer periphery of the anode electrode 40 is covered with the insulating film 70. Other basic configurations are the same as those of the Schottky barrier diode 14 according to the fourth embodiment, so the same reference numerals are given to the same elements, and overlapping description will be omitted.

As described in the present embodiment, in the present invention, the outer periphery of the anode electrode 40 may be covered with the insulating film 70.

Eighth Embodiment

Figure 10:
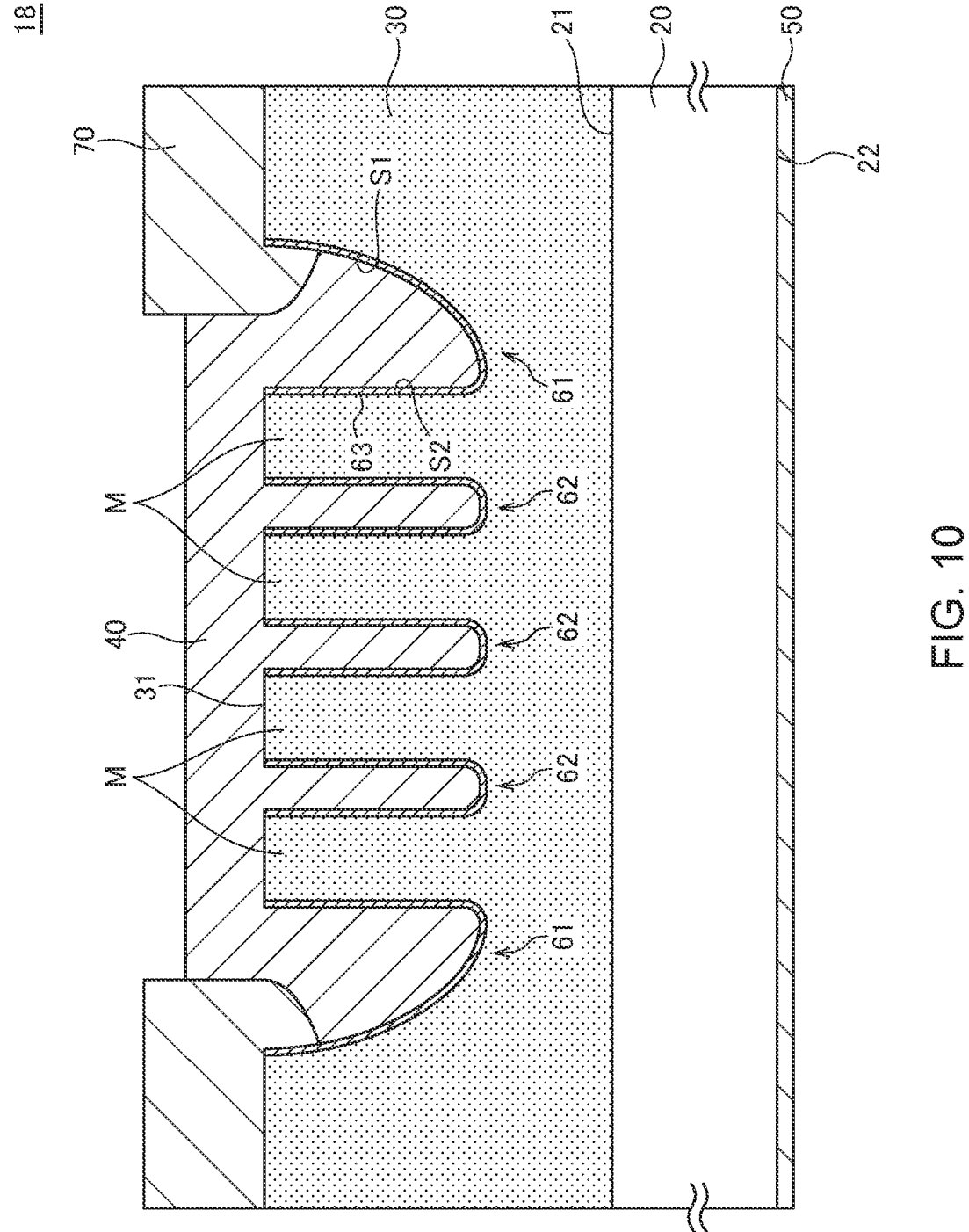
FIG. 10 is a schematic cross-sectional view illustrating the configuration of a Schottky barrier diode 18 according to an eighth embodiment of the present invention.

FIG. 10 is a schematic cross-sectional view illustrating the configuration of a Schottky barrier diode 18 according to an eighth embodiment of the present invention.

As illustrated in FIG. 10, the Schottky barrier diode 18 according to the eighth embodiment differs from the Schottky barrier diode 15 according to the fifth embodiment in that the insulating film 70 is embedded in a part of the outer peripheral trench 61. Other basic configurations are the same as those of the Schottky barrier diode 15 according to the fifth embodiment, so the same reference numerals are given to the same elements, and overlapping description will be omitted.

As described in the present embodiment, in the present invention, the insulating film 70 may be embedded in a part of the outer peripheral trench 61.

While the preferred embodiment of the present disclosure has been described, the present disclosure is not limited to the above embodiment, and various modifications may be made within the scope of the present disclosure, and all such modifications are included in the present disclosure.

EXAMPLES

Example 1

A simulation model of Example 1 having the same structure as the Schottky barrier diode 11 illustrated in FIGS. 1 and 2 was assumed, and electric field strength was simulated with a backward voltage of 600 V applied between the anode electrode 40 and the cathode electrode 50. The dopant concentration of the semiconductor substrate

20 was set to $1 \times 10^{18}$ cm$^{-3}$, and the dopant concentration of the drift layer 30 was to $4 \times 10^{16}$ cm$^{-3}$. The thickness of the drift layer 30 was set to 7 μm. The depths of the outer peripheral trench 61 and the center trench 62 were both set to 3 μm. The width W2 of the center trench 62 and the width of the drift layer 30 at a part contacting the anode electrode 40 (i.e., width of the mesa region M) were both set to 1.5 μm. As the insulating film 63, an HfO$_2$ film having a thickness of 50 nm was used. The anode electrode was made of Cu, and the cathode electrode 50 was formed of a laminated film of Ti and Au. Then, the simulation was performed using the width W1 of the outer peripheral trench 61 as a variable.

Figure 11:
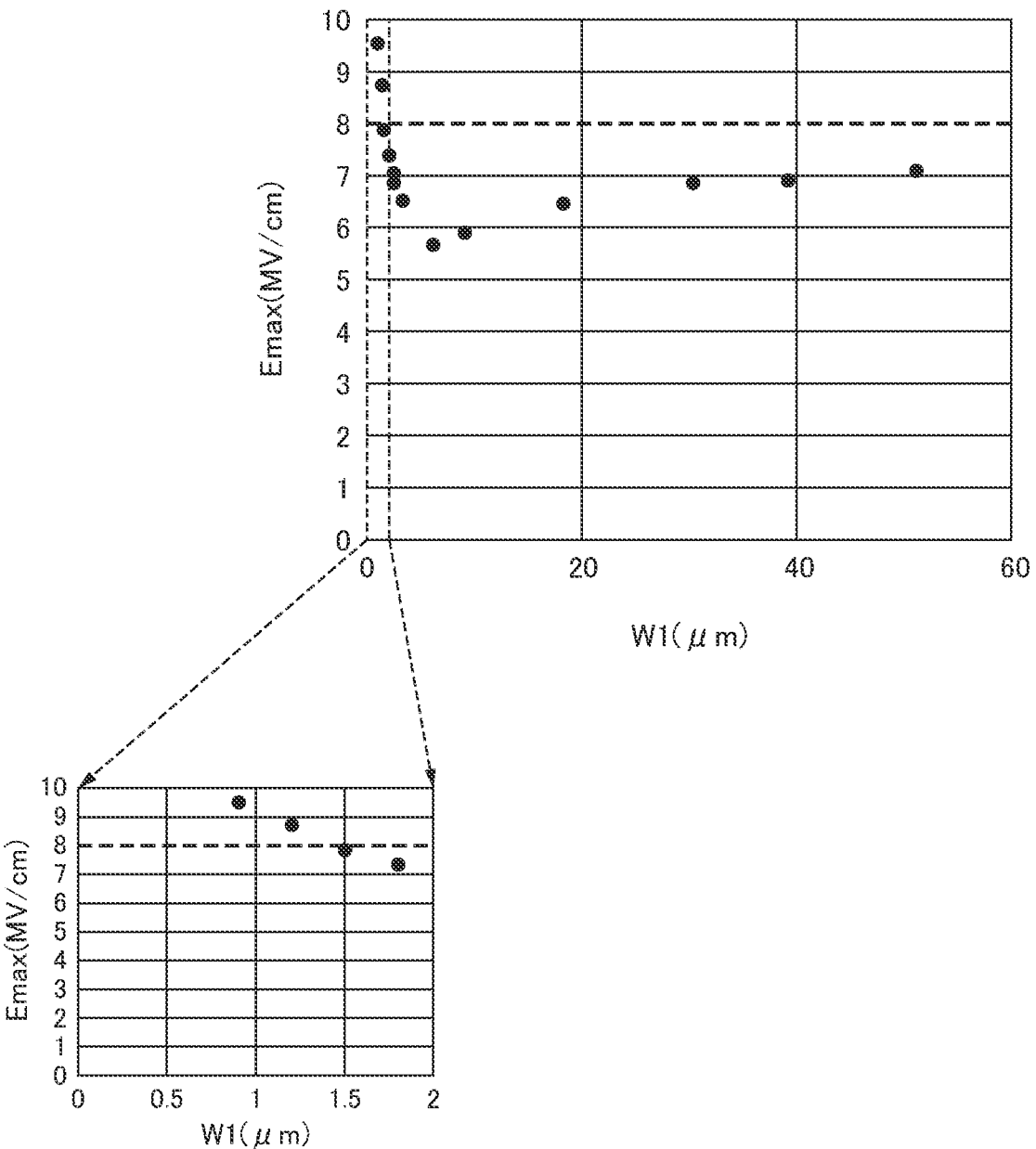
FIG. 11 is a graph illustrating the simulation results of an Example 1.

The simulation results are illustrated in FIG. 11. As illustrated in FIG. 11, when the width W1 of the outer peripheral trench 61 was less than 1.5 μm (width W2 of the center trench 62, mesa width), a maximum electric field strength (Emax) applied to the outer peripheral wall S1 exceeded 8 MV/cm which was the dielectric breakdown electric field strength of gallium oxide. On the other hand, when the width W1 of the outer peripheral trench 61 was equal to or more than 1.5 μm, the maximum electric field strength applied to the outer peripheral wall S1 was equal to or less than 8 MV/cm which was the dielectric breakdown electric field strength of gallium oxide. In particular, when the width W1 of the outer peripheral trench 61 was 6 μm, the electric field strength became the weakest (5.6 MV/cm). When the width W1 of the outer peripheral trench 61 was 10 μm, the maximum electric field strength was 5.8 MV/cm. When the width W1 of the outer peripheral trench 61 was increased further, the electric field strength slightly increases; however, the maximum electric field strength decreased to equal to or less than 7 MV/cm when the width W1 of the outer peripheral trench 61 was equal to or less than 40 μm.

Comparative Example

A simulation model of Comparative Example 1 having the same structure as the Schottky barrier diode 10 illustrated in FIG. 3 was assumed, and the simulation was performed under the same conditions as those for Example 1. The outer peripheral trench 61 had a symmetrical shape, and the width W1 thereof was set to 10 μm. As a result, the maximum electric field strength at the outer peripheral bottom portion A illustrated in FIG. 3 was 8.6 MV/cm.

Example 2

A simulation model of Example 2 having the same structure as the Schottky barrier diode 13 illustrated in FIG. 5 was assumed, and the simulation was performed under the same conditions as those for Example 1. In this simulation, the width W1 of the outer peripheral trench 61 was fixed to 3 μm, and the depth D1 of the outer peripheral trench 61 was used as a variable.

Figure 12:
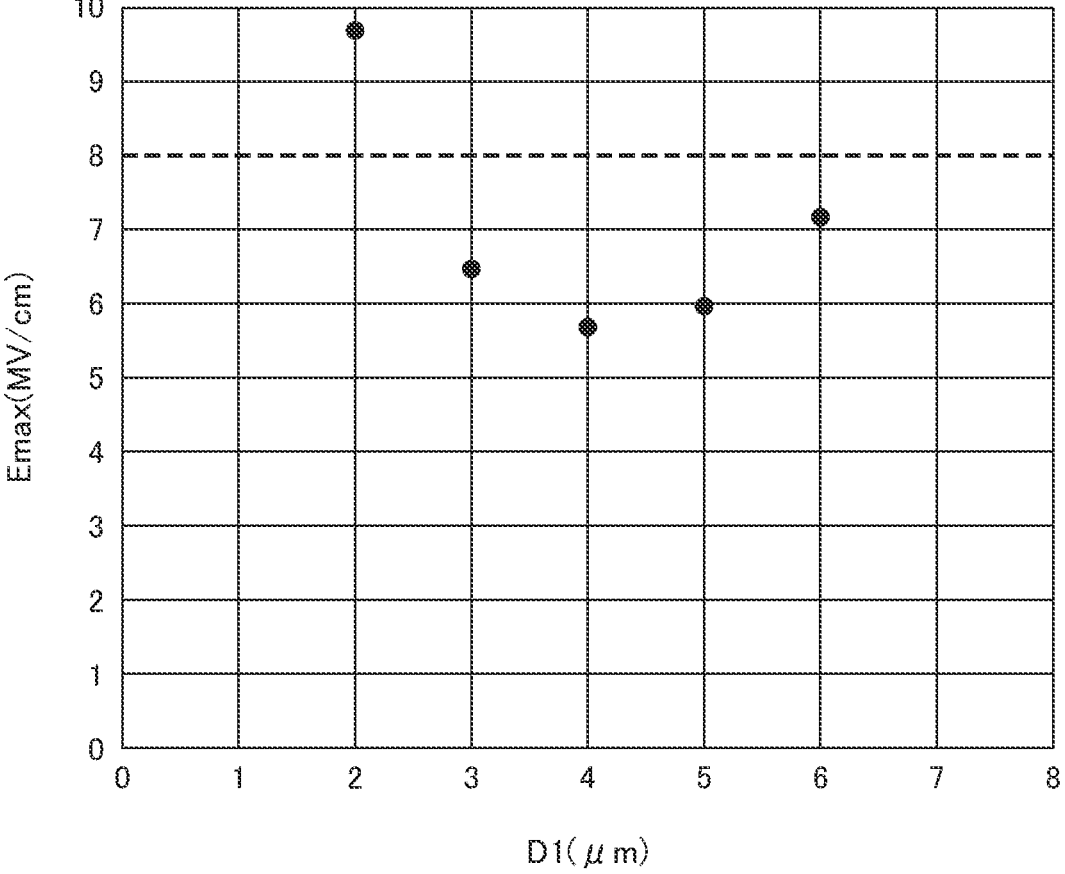
FIG. 12 is a graph illustrating the simulation results of an Example 2.

The simulation results are illustrated in FIG. 12. As illustrated in FIG. 12, when the depth D1 of the outer peripheral trench 61 was equal to the depth D2 (3 μm) of the center trench 62, the maximum electric field strength was 6.5 MV/cm. When the depth D1 of the outer peripheral trench 61 was set larger than the depth D2 of the center trench 62, the electric field strength decreases further, and the maximum electric field strength when the depth D1 of the outer peripheral trench 61 was 4 μm was 5.7 MV/cm. However, when the depth D1 of the outer peripheral trench 61 was 6 μm, the film thickness of the drift layer 30 excessively decreased, with the result that the maximum electric field strength was 7.2 MV/cm. On the other hand, when the depth D1 of the outer peripheral trench 61 was set to 2 μm which was smaller than the depth D2 of the center trench 62, the maximum electric field strength exceeded 8 MV/cm which was the dielectric breakdown electric field strength of gallium oxide.

REFERENCE SIGNS LIST 10-18 Schottky barrier diode
20 semiconductor substrate
21 upper surface of semiconductor substrate
22 back surface of semiconductor substrate
30 drift layer
31 upper surface of the drift layer
40 anode electrode
50 cathode electrode
61 outer peripheral trench
62 center trench
63, 70 insulating film
A outer peripheral bottom portion
B inner peripheral bottom portion
M mesa region
S1 outer peripheral wall
S2 inner peripheral wall
S3 bottom surface
What is claimed is:

1. A Schottky barrier diode comprising:
a semiconductor substrate made of gallium oxide;
a drift layer made of gallium oxide and provided on the semiconductor substrate;
an anode electrode brought into Schottky contact with the drift layer;
a cathode electrode brought into ohmic contact with the semiconductor substrate; and
a first insulating film covering an inner wall of a trench formed in the drift layer,
wherein the trench includes a ring-shaped outer peripheral trench and a center trench formed in an area surrounded by the outer peripheral trench,
wherein a part of the anode electrode is embedded in the outer peripheral trench and the center trench through the first insulating film, wherein the outer peripheral trench is larger in width than the center trench,
wherein the outer peripheral trench includes an outer peripheral wall surface and an inner peripheral wall surface being closer to the center trench than the outer peripheral wall surface,
wherein, in a cross-sectional view, a first portion of the outer peripheral wall surface and a second portion of the inner peripheral wall surface each extend from an opening of the outer peripheral trench to a first depth measured from the opening in a thickness direction of the semiconductor substrate,
wherein, in the cross-sectional view, the first portion of the outer peripheral wall surface has a curved surface having a curvature that becomes smaller from the first depth toward the opening of the outer peripheral trench, and
wherein the second portion of the inner peripheral wall surface of the outer peripheral trench is less curved than the first portion of the outer peripheral wall surface.

2. The Schottky barrier diode as claimed in claim 1, wherein the outer peripheral trench is larger in depth than the center trench.

3. The Schottky barrier diode as claimed in claim 1, further comprising a second insulating film that covers the anode electrode inside the outer peripheral trench.

4. The Schottky barrier diode as claimed in claim 2, further comprising a second insulating film that covers the anode electrode inside the outer peripheral trench.

5. The Schottky barrier diode as claimed in claim 1,
wherein, in the cross-sectional view, the second portion of the inner peripheral wall surface is a non-curved surface, and
wherein, in the cross-sectional view, within the first depth from the opening, the curvature of the first portion of the outer peripheral wall surface becomes smaller toward the opening of the outer peripheral trench such that an upper end portion of the first portion adjoining the opening has a non-curved surface.

* * * * *